United States Patent [19]

Kikuchi

[11] Patent Number: 4,682,087
[45] Date of Patent: Jul. 21, 1987

[54] APPARATUS FOR CONTROLLING AMPLITUDE OF VERTICAL DEFLECTION SIGNAL

[75] Inventor: Masafumi Kikuchi, Tokyo, Japan
[73] Assignee: Sony Corporation, Tokyo, Japan
[21] Appl. No.: 833,402
[22] PCT Filed: May 29, 1985
[86] PCT No.: PCT/JP85/00293
  § 371 Date: Jan. 28, 1986
  § 102(e) Date: Jan. 28, 1986
[87] PCT Pub. No.: WO85/05751
  PCT Pub. Date: Dec. 19, 1985

[30] Foreign Application Priority Data

May 29, 1984 [JP] Japan .................... 59-109257

[51] Int. Cl.⁴ .................... H02J 29/70; H04N 5/52
[52] U.S. Cl. .................... 315/387; 358/174; 358/177
[58] Field of Search ............ 331/175, 204; 315/399, 315/387; 358/176, 177, 162, 172, 174; 328/27, 181, 183, 187; 307/228

[56] References Cited

U.S. PATENT DOCUMENTS

| | | | |
|---|---|---|---|
| 3,070,756 | 12/1962 | Fischman | 315/387 |
| 3,970,894 | 7/1976 | Yasuda et al. | 315/387 |
| 3,979,683 | 9/1976 | Ikeda | 358/177 |
| 4,104,567 | 8/1978 | Peer et al. | 315/387 |
| 4,323,923 | 4/1982 | Reneau | 358/174 |

Primary Examiner—Theodore M. Blum
Assistant Examiner—David Cain
Attorney, Agent, or Firm—Hill, Van Santen, Steadman & Simpson

[57] ABSTRACT

An amplitude of a sawtooth signal of a vertical period of a television signal is controlled. A level discriminating circuit 7 discriminates whether or not the amplitude of the sawtooth signal of the vertical period lies within a level of an almost proper level. There is provided a counter 9 to count a vertical sync signal when the amplitude is out of this level range. An output of the counter 9 is converted into an analog amplitude control signal by a D/A converter 12, thereby making it possible to control the amplitude at a high response speed.

7 Claims, 5 Drawing Figures

APPARATUS FOR CONTROLLING AMPLITUDE OF VERTICAL DEFLECTION SIGNAL

TECHNICAL FIELD

The present invention relates to an apparatus for controlling an amplitude of a vertical deflection signal which is applied to control the amplitude of the vertical deflection signal of a television receiver.

BACKGROUND ART

Recently, television receivers are also used as output display sections of microcomputer apparatuses. However, the vertical frequency of an output video signal which is outputted from the microcomputer apparatus is determined from the number of characters in one line or the like and is not limited to the standard frequency of 60 Hz but differs within a range of, for example, 50 to 60 Hz.

In the case of supplying such a video signal to the television receiver, there occur the problems such as inferior vertical linearity, inferior horizontal pin distortion, vertical pull-out, overamplitude of or lack of amplitude of vertical deflection, and the like.

For example, assuming that the frequency of a vertical sync signal $V_{sy}$ shown in FIG. 5A increased as shown by broken lines than that represented by a solid line, the amplitude of the vertical deflection signal decreases as shown by a broken line in FIG. 5B. Thus, the vertical deflection amplitude lacks.

There has conventionally been known the method whereby the change in vertical amplitude due to the difference in vertical frequency between the NTSC and CCIR systems is corrected by switching the value of the circuit element by a manual switch. However, according to this constitution, it is necessary to operate the manual switch and the vertical amplitude cannot be automatically corrected, so that it is improper for correction of the vertical amplitude when the output video signal of the microcomputer apparatus is displayed.

To automatically correct the vertical amplitude, it is necessary to detect the variation in vertical amplitude corresponding to the vertical frequency of the input signal. As an example of detection of the change of the vertical frequency, there has been known the method whereby a monostable multivibrator is triggered by a vertical sync signal and its output signal is integrated and the vertical frequency is determined from the level of the integrated output. However, since the vertical frequency is fairly low, the value of the capacitor for integration is large and there is a drawback such that response speed is low when the vertical frequency changes.

DISCLOSURE OF INVENTION

It is therefore an object of the present invention to provide an apparatus for controlling an amplitude of a vertical deflection signal in which a response speed is high and there is no need to largely change the existing circuit.

This invention relates to an apparatus for controlling an amplitude of a vertical deflection signal comprising: a level discriminating circuit to discriminate that an amplitude of a sawtooth voltage of a vertical period lies within a range of an almost proper level; a counter whose counting operation is designated so as to either increase or decrease in response to an output signal of the level discriminating circuit and which counts a vertical sync signal on the basis of the output of the level discriminating circuit when the amplitude of the sawtooth voltage of the vertical period is out of the range of the almost proper level; and a D/A converter to convert an output of the counter into an analog detection signal.

According to the invention, the vertical amplitude can be detected at a good response speed, different from the conventional method whereby the monostable multivibrator is triggered by the vertical sync signal and its output is integrated. Therefore, it is possible to prevent the influence on the video interval by the fluctuation in vertical synchronization when the input video signal is switched.

This invention also has advantages such that there is no need to newly constitute the whole system as in the digital television receiver and there is no need to largely change the existing circuit.

BEST MODE FOR CARRYING OUT THE INVENTION

Figure 1:
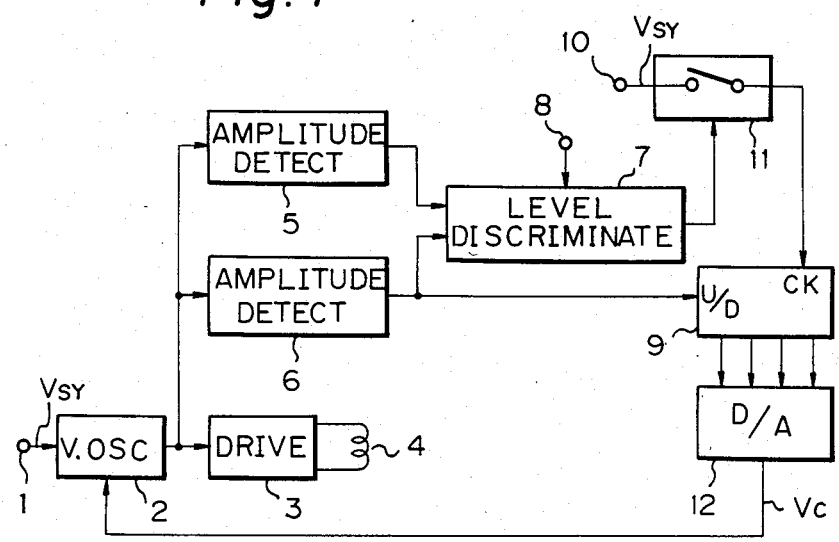
FIG. 1 is a block diagram of an embodiment of the present invention.

An embodiment of the present invention will be described hereinbelow. FIG. 1 shows a whole constitution of the embodiment of the invention, in which reference numeral 1 denotes an input terminal of a vertical sync signal $V_{sy}$; 2 is a vertical oscillating circuit; 3 is a vertical drive circuit; and 4 is a vertical deflection coil.

The vertical sawtooth voltage appearing as an output of the vertical oscillating circuit 2 is supplied to amplitude detecting circuits 5 and 6. The amplitude detecting circuit 5 compares an amplitude $E_v$ of the sawtooth voltage with a reference voltage $VT_1$. The amplitude detecting circuit 6 compares the amplitude $E_v$ of the sawtooth voltage with a reference voltage $VT_2$. The amplitude detecting circuit 5 generates a detection signal which becomes H (high level) when ($VT_1 < E_v$) and becomes L (low level) in the other cases. The amplitude detecting circuit 6 generates a detection signal which becomes H when ($VT_2 > E_v$) and becomes L (low level) in the other cases.

The detection signals of the amplitude detecting circuits 5 and 6 are supplied to a level discriminating circuit 7. A vertical blanking signal is supplied from a terminal 8 to the level discriminating circuit 7. The level discriminating circuit 7 discriminates the level only for the vertical blanking interval. For the vertical blanking interval, the level discriminating circuit 7 generates a discrimination output which becomes H when one of the detection signals of the amplitude detecting circuits 5 and 6 is H and becomes L when both of these detection signals are L.

A detection output of the amplitude detecting circuit 6 is supplied to an up/down counter 9 as a signal to control the direction (count-up or count-down) of the counting operation thereof. When the detection output is L, the counter 9 performs the counting-up operation. When the detection output is H, the counter 9 executes the counting-down operation. The vertical sync singal $V_{sy}$ from a terminal 10 is supplied as a clock input to the counter 9 through a gate circuit 11. Thus, the content of the counter 9 is increased or decreased one by one for every vertical period by the vertical sync signal $V_{sy}$.

The gate circuit 11 is turned on when the discrimination output of the level discriminating circuit 7 is H and is turned off when the discrimination output of the level discriminating circuit 7 is L. The discrimination output of the level discriminating circuit 7 may be supplied to a counter enable terminal in place of the gate circuit 11.

The output signal, for example, four-bit output of the counter 9 is supplied to a D/A converter 12 and converted into an analog control voltage $V_c$. The control voltage $V_c$ is supplied as a correction signal to the vertical oscillating circuit 2. In this embodiment, the magnitude of a discharging constant current of an integrator to generate the sawtooth voltage of the vertical oscillating circuit 2 is controlled by the control voltage $V_c$.

The operation of the embodiment of the invention mentioned above will be described with reference to FIGS. 2 and 3.

Figure 2A:
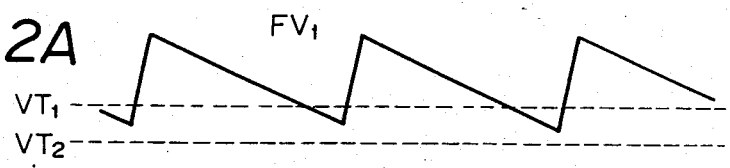
FIG. 2 is a waveform diagram for use in explanation of the operation of the embodiment of the invention.

FIG. 2A shows a state in which the vertical frequency is $FV_1$ and the amplitude of the vertical deflection signal is proper. The level relation of $(VT_1 > E_v > VT_2)$ is satisfied within the vertical blanking interval. At this time, the detection outputs of the amplitude detecting circuits 5 and 6 are L and the gate circuit 11 is not turned on, so that the content of the counter 9 does not change.

Figure 2B:
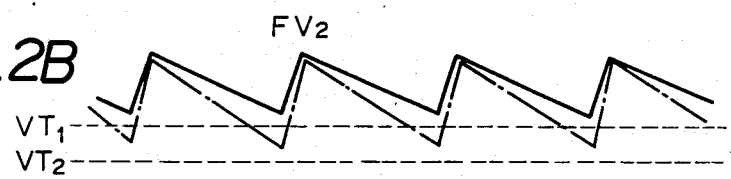

When the vertical frequency increases from $FV_1$ and becomes $FV_2$, the vertical amplitude $E_v$ decreases as shown in FIG. 2B. At this time, the vertical amplitude $E_v$ increases for the vertical blanking interval due to the reference voltages $VT_1$ and $VT_2$. Thus, the detection output of the amplitude detecting circuit 5 becomes H and the output of the amplitude detecting circuit 6 becomes L and the discrimination output of the level discriminating circuit 7 becomes H. The gate circuit 11 is turned on due to this discrimination output and the vertical sync signal $V_{sy}$ is counted by the counter 9. In addition, since the detection output of the amplitude detecting circuit 6 is L, the counter 9 performs the counting-up operation and the content is increased by "1" and the control voltage $V_c$ from the D/A converter 12 increases.

A check is likewise made to see if the vertical amplitude $E_v$ is proper or not for the next vertical blanking interval. If the amplitude is still small, the counter 9 counts the vertical sync signal $V_{sy}$ and the control voltage $V_c$ increases. By repeating this operation, the proper vertical amplitude $E_v$ is derived.

Figure 2C:
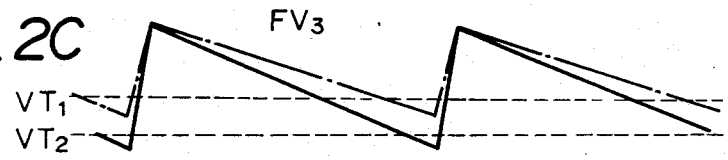

When the vertical frequency decreases from $FV_1$ and becomes $FV_3$, the vertical amplitude $E_v$ increases as shown in FIG. 2C. At this time, the vertical amplitude $E_v$ decreases for the vertical blanking interval due to the reference voltages $VT_1$ and $VT_2$. Therefore, the detection output of the amplitude detecting circuit 5 is L and the output of the amplitude detecting circuit 6 becomes H and the discrimination output of the level discriminating circuit 7 becomes H. The gate circuit 11 is turned on due to this discrimination output and the vertical sync signal $V_{sy}$ is counted by the counter 9. On one hand, since the detection output of the amplitude detecting circuit 6 is H, the counter 9 performs the counting-down operation, so that the content is reduced by "1" and the control voltage $V_c$ from the D/A converter 12 decreases.

A check is similarly made to see if the vertical amplitude $E_v$ is proper or not for the next vertical blanking interval. If the amplitude is still large, the counter 9 counts the vertical sync singal $V_{sy}$ and the control voltage $V_c$ decreases. By repeating this operation, the proper vertical amplitude $E_v$ is obtained.

Figure 3A:
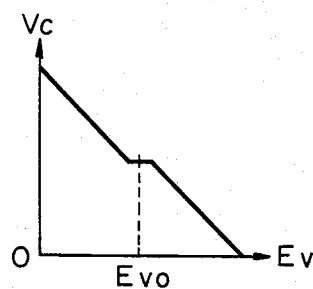
FIG. 3 is a schematic diagram for use in explanation of the operation of the embodiment of the invention.

FIG. 3A shows the relation between the vertical amplitude $E_v$ and the control voltage $V_c$. The control voltage $V_c$ does not change when the vertical amplitude $E_v$ lies within a predetermined range around the proper amplitude value $E_{v0}$. When the vertical amplitude $E_v$ deviates from this predetermined range, the control voltage $V_c$ changes in correspondence to the vertical amplitude $E_v$.

Figure 3B:
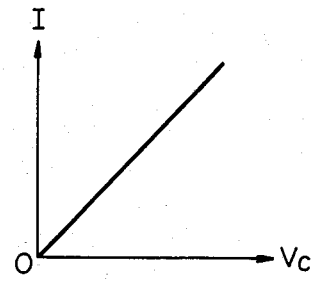

On the other hand, there is the relation as shown in FIG. 3B between the control voltage $V_c$ and the discharging constant current I. The discharging constant current I changes in proportion to the control voltage $V_c$. Therefore, as shown in FIG. 2B, when the vertical amplitude $E_v$ becomes too small, the discharging constant current I is increased and as indicated by an alternate long and short dash line, the gradient of the sawtooth voltage is increased and the vertical amplitude $E_v$ is corrected so as to be enlarged. On the contrary, when the vertical amplitude $E_v$ becomes too large as shown in FIG. 2C, the discharging constant current I is reduced and as indicated by an alternate long and short dash line, the gradient of the sawtooth voltage is decreased and the vertical amplitude $E_v$ is corrected so as to be reduced.

Due to the above operation, the amplitude is automatically controlled so that the vertical amplitude $E_v$ lies within a predetermined range around the proper amplitude value $E_{v0}$. This predetermined range is determined by the reference voltages $VT_1$ and $VT_2$ and its magnitude is selected to a value such that the amplitude difference of the vertical deflection does not cause a visual problem.

Figure 4:
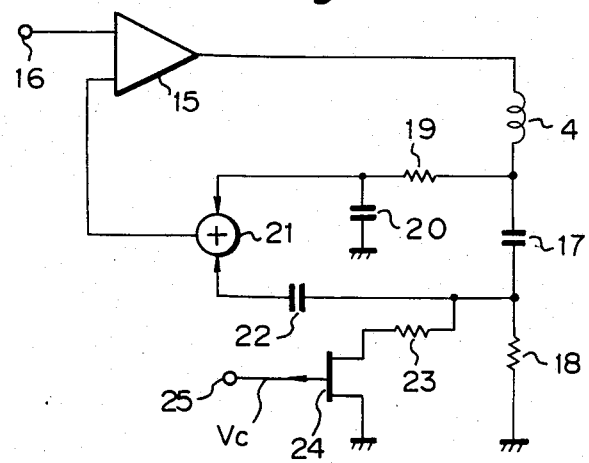
FIG. 4 is a connection diagram showing another embodiment of the invention.
Figure 5A:
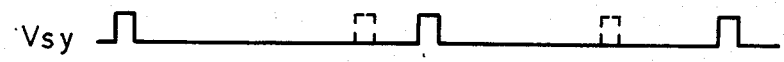
FIG. 5 is a waveform diagram for use in explanation of a variation in vertical amplitude.
Figure 5B:
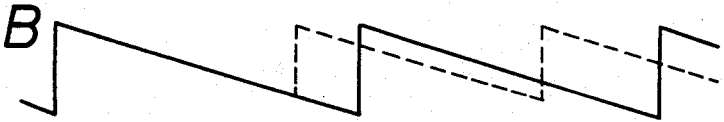

FIG. 4 shows another example of the circuit to correct the vertical amplitude $E_v$. Numeral 15 denotes a vertical drive amplifier. A series circuit of the vertical deflection coil 4, a capacitor 17, and a detecting resistor 18 is connected between an output of the vertical drive amplifier 15 and the ground. A vertical parabolic voltage which is generated at a connecting point of the vertical deflection coil 4 and capacitor 17 is supplied to an adding circuit 21 through an integrating circuit consisting of a resistor 19 and a capacitor 20. A sawtooth voltage which is generated across the detecting resistor 18 is supplied to the adding circuit 21 through a capacitor 22. An output signal of the adding circuit 21 is fed back to the vertical drive circuit 15 in a negative feedback manner. The vertical linearity is corrected by this negative feedback circuit.

A resistor 23 and an FET 24 serving as a variable impedance element are connected in parallel with the detecting resistor 18. The control voltage $V_c$ obtained in the manner as mentioned above is added from a terminal 25 to a gate of the FET 24. Therefore, the impedance between the drain-source of the FET 24 is controlled by the control voltage $V_c$ and the negative feedback amount to the vertical drive amplifier 15 is controlled and the vertical amplitude is corrected.

INDUSTRIAL APPLICABILITY

As well as the control of the vertical amplitude, the invention can be applied to other problems which are caused when the vertical frequency changes, for example, to the control of the vertical amplitude when correcting the change in amplitude of a vertical parabolic voltage for use in correction of right and left pin distortions.

I claim:

1. An apparatus for controlling an amplitude of a vertical deflection signal comprising:
    a vertical oscillating circuit for generating a sawtooth signal having a vertical period;
    a detecting circuit for detecting whether an amplitude of said sawtooth signal is in a proper level range;
    a counter for counting a vertical synchronizing signal when the amplitude of said sawtooth signal is out of said range in response to an output of said detecting circuit; and
    a D/A converter for converting an output of said counter into an analog detection signal,
    characterized in that an amplitude of a vertical deflection signal formed by said sawtooth signal is controlled by an output of said D/A converter.

2. An apparatus for controlling an amplitude of a vertical deflection signal according to claim 1, wherein the output of said D/A converter is supplied to said vertical oscillating circuit.

3. An apparatus for controlling an amplitude of a vertical deflection signal according to claim 2, wherein said detecting circuit has an amplitude detecting circuit for detecting the amplitude of said sawtooth signal and a level judging circuit for judging whether the amplitude of said sawtooth signal is in a proper level range, said level detecting circuit being supplied with output of said amplitude detecting circuit,
    and said counter is designated to either counting-up or counting-down operations by the output signal of said amplitude detecting circuit and initiated to count said vertical synchronizing signal by an output signal of said level judging circuit.

4. An apparatus for controlling an amplitude of a vertical deflection signal according to claim 3, wherein said amplitude detecting circuit has a first amplitude detecting circuit having a first threshold level and a second amplitude detecting circuit having a second threshold level.

5. An apparatus for controlling an amplitude of a vertical deflection signal according to claim 4, wherein said level judging circuit is supplied with a vertical blanking signals and judges during vertical blanking intervals.

6. An apparatus for controlling an amplitude of a vertical deflection signal according to claim 5, wherein said vertical synchronizing signal is supplied to said counter by the output of said level judging circuit.

7. An apparatus for controlling an amplitude of a vertical deflection signal according to claim 1, further comprising:
    a vertical drive circuit supplied with an output of said vertical oscillating circuit;
    a vertical deflection coil supplied with the vertical deflection signal from said vertical drive circuit;
    a series circuit having a capacitor and a resistor connected to said vertical deflection coil; and
    a variable impedance device having a control terminal connected in parallel with said resistor,
    wherein said analog detection output is supplied to said control terminal of said variable impedance device.

* * * * *